United States Patent [19]

Hossain et al.

[11] Patent Number: 6,014,506
[45] Date of Patent: *Jan. 11, 2000

[54] METHOD AND APPARATUS FOR IMPROVING ENGINEERING CHANGE ORDER PLACEMENT IN INTEGRATED CIRCUIT DESIGNS

[75] Inventors: Moazzem Hossain, San Jose; Bala Thumma, Milpitas; Sunil Ashtaputre, San Jose, all of Calif.

[73] Assignee: VLSI Technology, Inc., San Jose, Calif.

[ * ] Notice: This patent is subject to a terminal disclaimer.

[21] Appl. No.: 08/621,742

[22] Filed: Mar. 21, 1996

Related U.S. Application Data

[63] Continuation-in-part of application No. 08/550,848, Oct. 31, 1995.

[51] Int. Cl.[7] .................................................. G06F 17/50
[52] U.S. Cl. ............................... 395/500.12; 395/500.15
[58] Field of Search .................................... 364/488–491

[56] References Cited

U.S. PATENT DOCUMENTS

| | | | |
|---|---|---|---|
| 5,111,413 | 5/1992 | Lazansky et al. | 364/578 |
| 5,396,435 | 3/1995 | Ginetti | 364/489 |
| 5,461,576 | 10/1995 | Tsay et al. | 364/490 |
| 5,550,748 | 8/1996 | Xiong | 364/488 |
| 5,557,533 | 9/1996 | Koford et al. | 364/491 |
| 5,638,291 | 6/1997 | Li et al. | 364/490 |
| 5,754,826 | 5/1998 | Gamal et al. | 395/500 |

OTHER PUBLICATIONS

Yan et al. "Orientation Assignment of Standard Cells Using a Fuzzy Mathematical Transformation." IEEE, pp. 1014–1019, Aug. 1994.

Baker et al. "Optimisation Efficiency in Behavioral Synthesis," IEEE, pp. 399–406, Oct. 1994.

Sechen et al. "An Improved Simulated Annealing Algorithm for Row–Based Placement," IEEE, pp. 478–481, Nov. 1987.

Ginetti et al, "Modifying The Netlist After Placement For Performance Improvement," IEEE, pp. 9.2.1–9.2.4., 1993.

Doll, Konrad et al., "Iterative Placement Improvement by Network Flow Methods," IEEE, Oct. 1994, vol. 13, No. 10, pp. 1189–1200.

Hossain, Moazzem et al., "A New Faster Algorithm for Iterative Placement Improvement," Compass Design Automation, Mar. 22, 1996, pp. 1–13.

1.132 Affidavit and Software Release Notes, *Physical Design Tools V8R4.6.5 Beta,* Nov. 14, 1994, Compass Design Automation, San Jose, CA.

*Primary Examiner*—Kevin J. Teska
*Assistant Examiner*—Vuthe Siek
*Attorney, Agent, or Firm*—Hickman Stephens & Coleman, LLP

[57] ABSTRACT

A method for laying out an integrated circuit design based upon a netlist provided by a behavioral synthesis tool includes the steps of: (A) placing cells specified by the netlist in a layout area in a placement step, the cells including pins that are interconnected by nets; (B) verifying timing constraints in a timing verification step of the placed cells in the layout area; and (C) if the timing verification step indicates that timing does not verify in that the timing constraints are not met: (a) modifying the netlist pursuant to an engineering change order (ECO); and (b) making an ECO placement of at least one cell into the layout area by (i) picking an unplaced cell from a set of unplaced cells to be a picked cell; (ii) determining a target window within said layout area for the placement of said picked cell; (iii) mapping said picked cell inside said target window; (iv) removing said picked cell from said set of unplaced cells; (v) optimizing the placement of said picked cell by analyzing said picked cell within said target window with respect to other cells, and modifying said placement of said picked cell if it improves timing; and (vi) repeating steps (i)–(v) until said set of unplaced cells is empty. A layout tool implements the method on a computer system to form a portion of an integrated circuit fabrication system.

29 Claims, 11 Drawing Sheets

| CIRCUIT | NUMBER CELLS | NUMBER NETS | NUMBER PADS |
|---|---|---|---|
| c1 | 1204 | 1309 | 134 |
| c2 | 6372 | 7268 | 158 |
| c3 | 14115 | 14930 | 220 |
| c4 | 14332 | 15339 | 149 |
| c5 | 14640 | 14921 | 192 |
| c6 | 34965 | 36643 | 349 |
| c7 | 27838 | 28977 | 259 |

Fig. 9a

| CIRCUIT | INITIAL NET LENGTH ($\lambda$) | DOMINO | | PRESENT INVENTION | |
|---|---|---|---|---|---|
| | | NET LENGTH ($\lambda$) | CPU (SEC) | NET LENGTH ($\lambda$) | CPU (SEC) |
| c1 | $1.87 \times 10^6$ | $1.67 \times 10^6$ | 100 | $1.65 \times 10^6$ | 14 |
| c2 | $6.98 \times 10^6$ | $5.46 \times 10^6$ | 756 | $5.43 \times 10^6$ | 112 |
| c3 | $2.78 \times 10^7$ | $2.03 \times 10^7$ | 1348 | $2.14 \times 10^7$ | 812 |
| c4 | $2.09 \times 10^7$ | $1.74 \times 10^7$ | 718 | $1.71 \times 10^7$ | 371 |
| c5 | $1.45 \times 10^7$ | $1.28 \times 10^7$ | 5227 | $1.30 \times 10^7$ | 563 |
| c6 | $4.94 \times 10^7$ | $4.58 \times 10^7$ | 15836 | $3.87 \times 10^7$ | 8631 |
| c7 | $6.27 \times 10^7$ | $5.9 \times 10^7$ | 12755 | $5.88 \times 10^7$ | 1943 |

Fig. 9b

METHOD AND APPARATUS FOR IMPROVING ENGINEERING CHANGE ORDER PLACEMENT IN INTEGRATED CIRCUIT DESIGNS

DESCRIPTION

This application is a continuation-in-part of co-pending patent application Ser. No. 08/550,848, filed Oct. 31, 1995, and entitled "Method and Apparatus for Implementing Engineering Change Orders in Integrated Circuit Designs," which is incorporated herein by reference.

TECHNICAL FIELD

This invention relates generally to the design of integrated circuits and more particularly to the automated design of integrated circuits by behavioral synthesis.

BACKGROUND ART

Over the past several decades, integrated circuits (ICs) have become an integral part of modem electrical devices. Rather than using "off-the-shelf" components, it is often desirable to use custom or semi-custom ICs. To permit easier circuit design of custom or semi-custom ICs to fulfill specific performance constraints or circuit requirements and to aid in circuit fabrication, automated systems for design and manufacturing have been developed. Automated design systems are also widely used to design highly complex ICs and ICs having short life cycles.

One type of computer aided design (CAD) system is known as a "behavioral synthesis system." With such a system, the inputs, outputs and other circuit parameters are input into a computer using a hardware description language (HDL). Behavioral synthesis software then designs a circuit meeting these parameters.

A typical integrated circuit design and manufacturing process using behavioral synthesis begins with certain performance or structural constraints. A description of these constraints is made using an HDL such as VHDL or VERILOG which are commercially available behavioral synthesis languages. This HDL can be manipulated to form a "netlist" (i.e. a list of "nets") specifying components and their interconnections which meet the circuit constraints. However, the actual placement plan of components on wafers and the topography of the wiring connections is reserved for a subsequent "layout" stage.

A conventional method 10 for fabricating an integrated circuit is outlined in a flowchart in FIG. 1 beginning at a step 12. In a step 14, a set of circuit specifications is developed. Generally, these specifications can include the overall integrated circuit performance and also specific size and placement characteristics of components on a chip.

A circuit designer will create a description of these specifications in a step 16 using a hardware description language (HDL). Common hardware description languages include the aforementioned VHDL and VERILOG although any suitable language (such as a proprietary HDL) may be used. The HDL description of the specifications is then used in a step 18 to synthesize a netlist. The netlist may also be described in the hardware description language (HDL). A step 20 verifies the behavior and functionality of the netlist, and allows for the repeating of steps 16 and 18 if the behavior and functionality do not meet specifications.

As noted above, the netlist specifies which components (known as "cells" or "modules") will be connected but does not specify the precise wiring topography. A cell has one or more "pins" for interconnection with pins of other cells. The "netlist" therefore includes "nets" which define the connectivity between pins of the cells. In other words, a "net" is a set of electrically equivalent pins of a number of cells, which must be connected together to form a common electrical node. Components or cells described by the netlist will form a circuit satisfying the circuit specifications.

Further referring to the conventional process of FIG. 1, the circuit designer transfers the verified netlist description into a layout tool in a step 24. The layout step 24 performed by the layout tool determines the actual physical placement of cells on the "layout area" of integrated circuit die or chip to form an array of gates or standard cells. The "layout area" is the area designated for the active components of the IC. The "placement" step of the layout process is extremely time consuming, as it can take several days of computation on a computer workstation for ICs having several hundred thousands of gates. The actual routing of connections or "wires" between pins of the cells is also determined in layout step 24.

Caltech Intermediate Format (C.I.F.) data created in the step 24 is transferred in a step 26 to a mask fabrication tool where an integrated circuit mask is created. This mask will be used to create the integrated circuit chip or die. This mask is generated on a machine equipped to read C.I.F. data. This C.I.F. data can be transferred to this machine through a hard disk, magnetic tape, a floppy disk, or other transmission medium. It is also possible for the mask generating machine to be part of or the same machine that synthesizes the netlist.

An integrated circuit is produced in a step 28. A conventional method of producing the circuit is to use the mask created in step 26 in photolithography processes. Once the chip itself has been fabricated, the integrated circuit on the die must have connections to external circuitry. This is generally accomplished by attaching bonding wires and/or lead frames to the integrated circuit. The circuit is then encapsulated in packaging materials such as plastic. The design and fabrication of the integrated circuit is completed at this point, as indicated at 30.

After the placement, if some of the constraints, such as timing requirements, are not met, the designer may change the netlist by adding some new cells (i.e. components) into the netlist or by replacing some of the existing cells by, typically, bigger cells. The problem encountered in the prior art is how to place the new or modified cells on the layout area such that the original placement of the other cells are minimally disturbed and the timing requirements are met. This problem is called ECO (Engineering Change Order) placement problem. In particular, it is hoped that the ECO will not require the placement step to be repeated because, as mentioned above, it is extremely time consuming.

Although the problem of ECO placement is very well-known and important in VLSI physical design, not much research has been done in this area. At the present time, there is no known published research work on the problem. Traditionally, ECO placement problem has been addressed using a very simple heuristic approach. Some of the industry tools use this simple approach to do the ECO placement. The heuristic works as follows:

(i) For gate array designs, try to place each new or changed cell in an empty base site close to a cell that shares a common net. If no such site found, place it in any empty legal site.

(ii) For standard cell designs, place each new cell at the end of a row with smaller row length. For each changed cell, place it in the same row and location by "pushing aside" (if necessary) the rest of the cells in the row so as to remove overlap of cells.

As noted above, the main objective of the ECO placement is to meet the timing requirements of circuits. The above mentioned heuristic approaches of the prior art, however, does not take the timing constraints into consideration. It is only with good luck that the ECO placements using the heuristics of the prior art would accomplish the desired timing constraints. This could require a completely new iteration of the layout process (including the placement step ) with many days of lost time.

A limited amount of prior art uses iterative placement improvement algorithms to place cells; however, these algorithms only work for row-based designs, i.e. these algorithms may not be used for non-row-based designs. "Domino" is an example of an iterative placement improvement algorithm which only works for row-based designs. "Iterative Placement Improvement by Network Flow Methods," *IEEE Transactions Computer-Aided Design*, vol. 13, no. 10, pp. 1189–2000, October 1994 by K. Doll, F. M. Johannes, and K. J. Antreich. As Domino does not work for non-row-based designs, ECO placement improvement for non-row-based designs are addressed using the above mentioned heuristic approaches.

DISCLOSURE OF THE INVENTION

A method in accordance with the present invention for laying out an integrated circuit design based upon a netlist provided by a behavioral synthesis tool includes the steps of: (A) placing cells specified by the netlist in a layout area in a placement step, the cells including pins that are interconnected by nets; (B) verifying timing constraints in a timing verification step of the placed cells in the layout area; and (C) if the timing verification step indicates that timing does not verify in that the timing constraints are not met: (a) modifying the netlist pursuant to an engineering change order (ECO); and (b) making an ECO placement of at least one cell into the layout area by (i) picking an unplaced cell from a set of unplaced cells to be a picked cell; (ii) determining a target window within said layout area for the placement of said picked cell; (iii) mapping said picked cell inside said target window; (iv) removing said picked cell from said set of unplaced cells; (v) optimizing the placement of said picked cell by analyzing said picked cell within said target window with respect to other cells, and modifying said placement of said picked cell if it improves timing; and (vi) repeating steps (i)–(v) until said set of unplaced cells is empty. A layout tool of the present invention implements the above-described process on a general purpose computer system to form a portion of an integrated circuit fabrication process for the manufacture of custom, semi-custom, complex, short life-cycle, and other types of integrated circuits.

The present invention provides an improved, automated method and apparatus for ECO placement that takes into account timing constraints and utilizes an iterative placement improvement algorithm which may be used for both row-based and non-row-based designs. It is therefore a major advantage of the present invention that the resulting "ECO placement improvement tool" does not require that the entire layout process (including cell placement) to be repeated to meet timing constraints. Rather, by iteratively invoking a number of optimizing processes including m-way interchange, move pass, and flip pass processes until timing constraints are met, the "ECO placement improvement tool" optimizes the layout process. A faster ECO placement improvement tool can significantly reduce the over-all physical design cycle, since the designer does not have to iterate through the placement process many times to get a good quality output. As noted above, this is a very major improvement because an IC with several hundred thousand components can take days to execute each iteration of the placement process.

Another advantage of the present invention is that the ECO placement tool produces good quality placement by placing the cells such that the total net length is minimized. This not only helps in meeting timing constraints, but also helps with the overall quality and performance of the layout.

These and other advantages of the present invention will become apparent upon reading the following detailed descriptions and studying the various figures of the drawings.

BRIEF DESCRIPTION OF THE DRAWINGS

FIG. 9a is a table of different circuits with row-based styles used in testing the layout process in accordance with the present invention; and FIG. 9b is a table of results generated for different circuits using a "Domino" layout process in accordance with prior art and the layout process in accordance with the present invention.

BEST MODES FOR CARRYING OUT THE INVENTION

Figure 1:
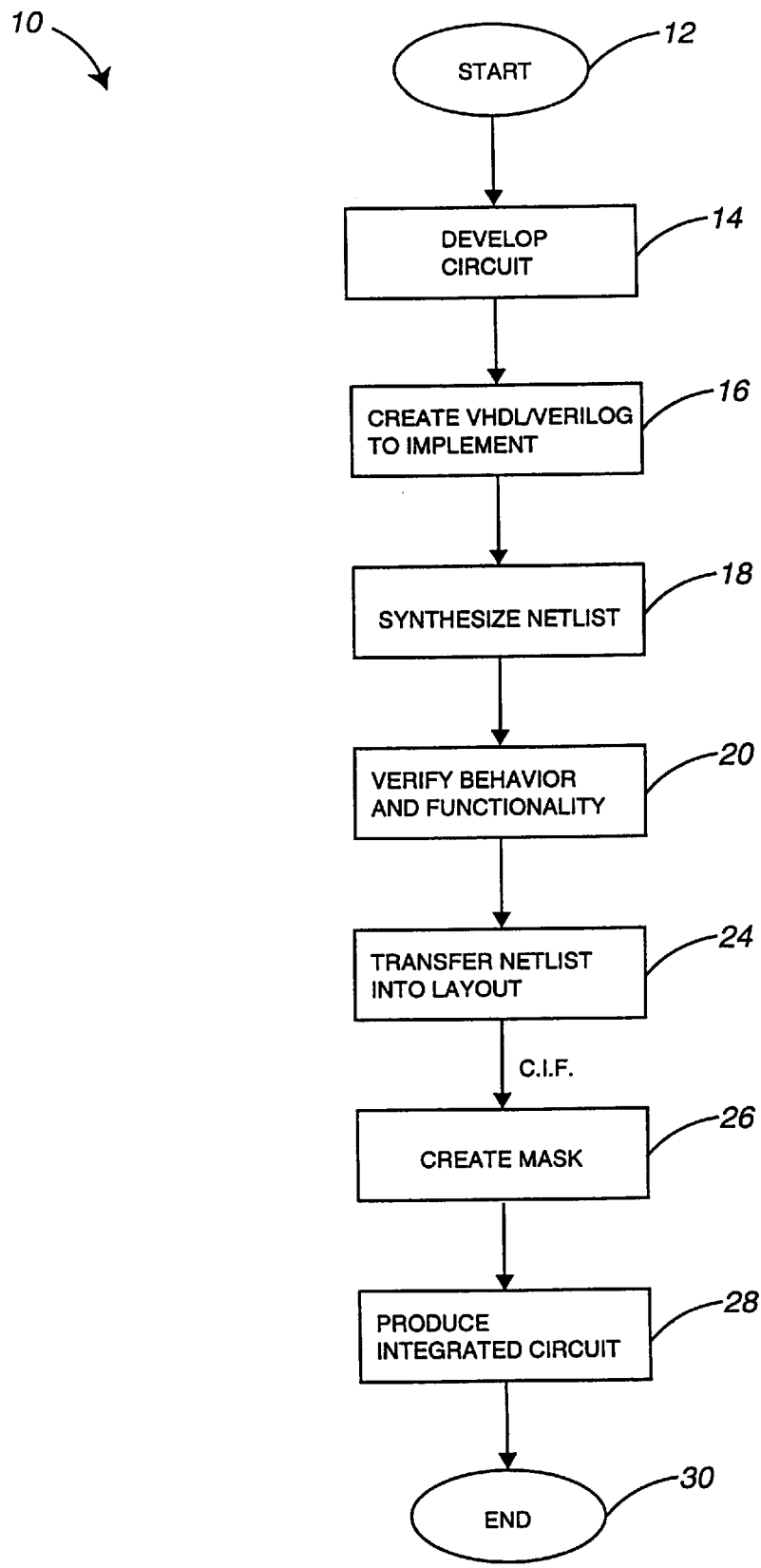
FIG. 1 is a process flow diagram illustrating a prior art process for designing and fabricating integrated circuits (ICs)
Figure 2:
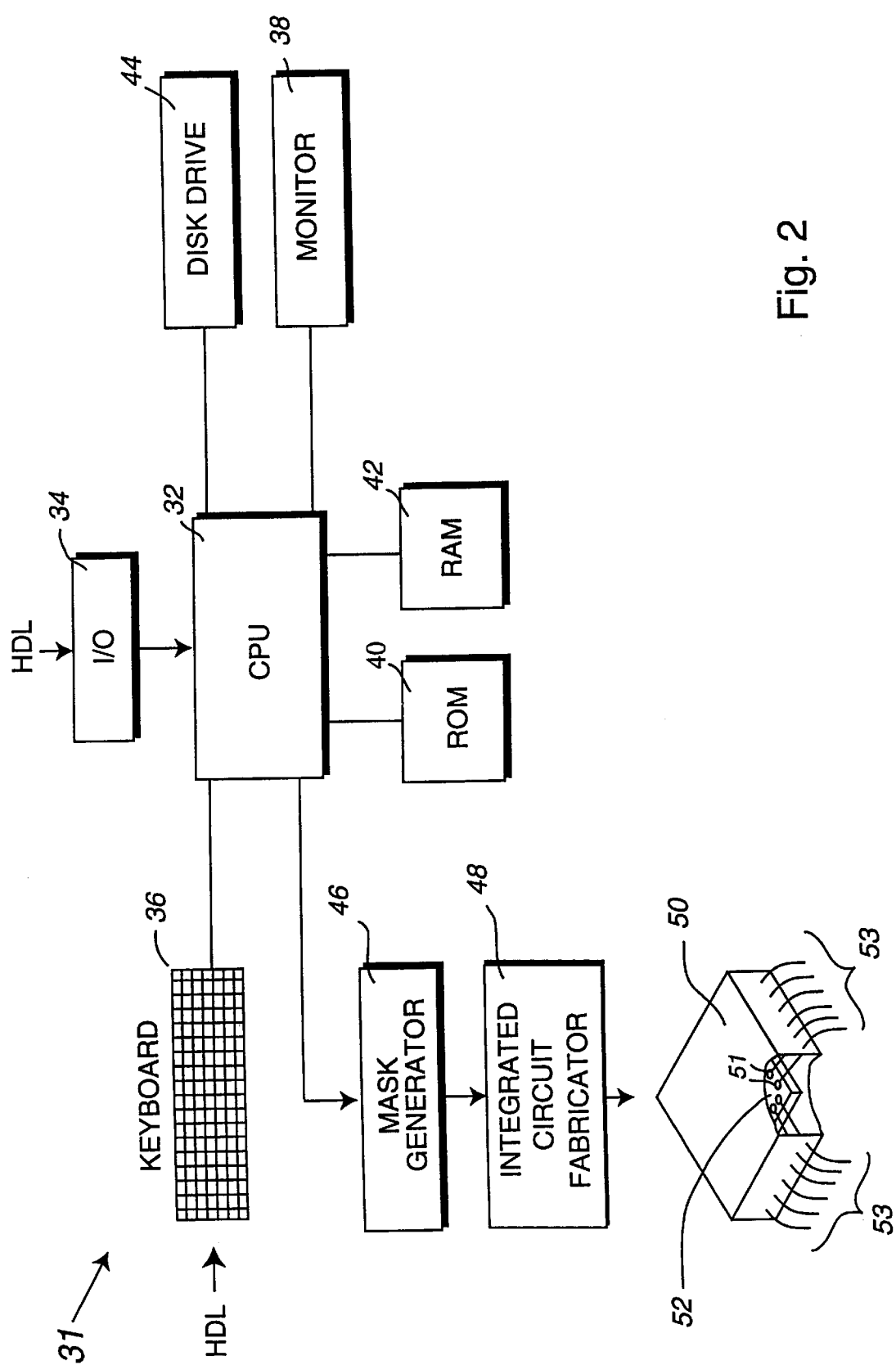
FIG. 2 is a block diagram of a system used to create integrated circuits.

FIG. 1 illustrates a prior art process for producing integrated circuits, and was discussed previously. In FIG. 2, a block diagram of an integrated circuit fabrication system 31 of the present invention is illustrated. The system 31 includes a central processing unit (CPU) 32, an I/O port 34, a keyboard 36, a monitor 38, ROM 40, RAM 42, a disk drive unit 44, a mask generator 46, and an IC fabricator 48. CPU 32 is coupled to I/O port 34 and to a user input device such as keyboard 36. HDL can be received and input into the system 31 through the I/O port 34, the user input device 36 or another input channel such as disk drive 44.

Typically, HDL received through the I/O port 34 comes from another machine (computer). This would be the case, for example, when a netlist is synthesized by another computer. The user input device 36 usually takes the form of a keyboard. It permits the circuit designer to input circuit specifications or to control netlist manipulations performed by the CPU. Again typically, the circuit designer using the input device or keyboard 36 will use a monitor 38 also coupled to the CPU 32.

The system processor 31 is preferably provided with various types of digital storage capacity. As shown in FIG. 2, this digital storage will typically include ROM 40, RAM 42, and a disk drive 44. The disk drive 44 may be used to store HDL received from the I/O ports 34 or the user input device 36 or may be used to enter HDL into the system, and it may store mask generation data created by processes running on the hardware description processor 31 and its CPU 32. The disk drive 44 may be replaced or augmented by other permanent storage devices such as magnetic tape or floppy disks. As noted, an original netlist can be either input through, for example, the I/O port 34 or the user input device 36, or it can be synthesized directly on the system 31.

From the netlist, the system 31 develops mask generation data. This mask generation data may be stored in digital storage, as for example the disk drive 44. The mask generator 46 receives the mask generation data from the CPU 32. Alternatively, (not shown) the mask generator 46 may receive mask generation data directly from digital storage such as the disk drive 44. The mask generator 46 may be part of the hardware description processor 31, or it may be a separate device. The mask generation data, or C.I.F., is used by the mask generator 46 to create photolithography masks. These masks will be used in an integrated circuit fabricator 48 to form components of the integrated circuit on a wafer. The mask will be sufficient to create the components on the integrated circuit and the connections between the components. The integrated circuit fabricator 48 includes semiconductor manufacturing equipment such as etchers, chemical vapor deposition (CVD) machines, lithography machines, etc. as is well known to those skilled in the art of semiconductor manufacturing.

The final result of processing by system 31 is a packaged integrated circuit 50. This packaged IC 50 will contain a die 52 created from using the mask created by the mask generator 46. The semiconductor die 52 typically contains a digital integrated circuit and I/O pads 51 for coupling the circuit to several leads 53. The I/O pads can be coupled to the leads 53 in any conventional manner such as by bonding wires.

The layout process of the present invention includes computer implemented processes executing on a digital computer, e.g. the CPU 32 of system 31. These processes are often referred to as "tools", since they fashion a data structure "object" into another form. In particular, a "layout tool" of the present invention includes an "ECO placement improvement tool" which aids in the efficient modification of the netlist in response to Engineering Change Orders (ECOs).

As noted above, a netlist describes a net which, in turn, specifies the components (cells) and their theoretical interconnections but not how they are physically laid-out and physically interconnected. In other words, a netlist is a theoretical description of a circuit. To make it a practical description, a layout process determines the placement of cells and the precise routing or wiring connections between pins of various cells.

Figure 3:
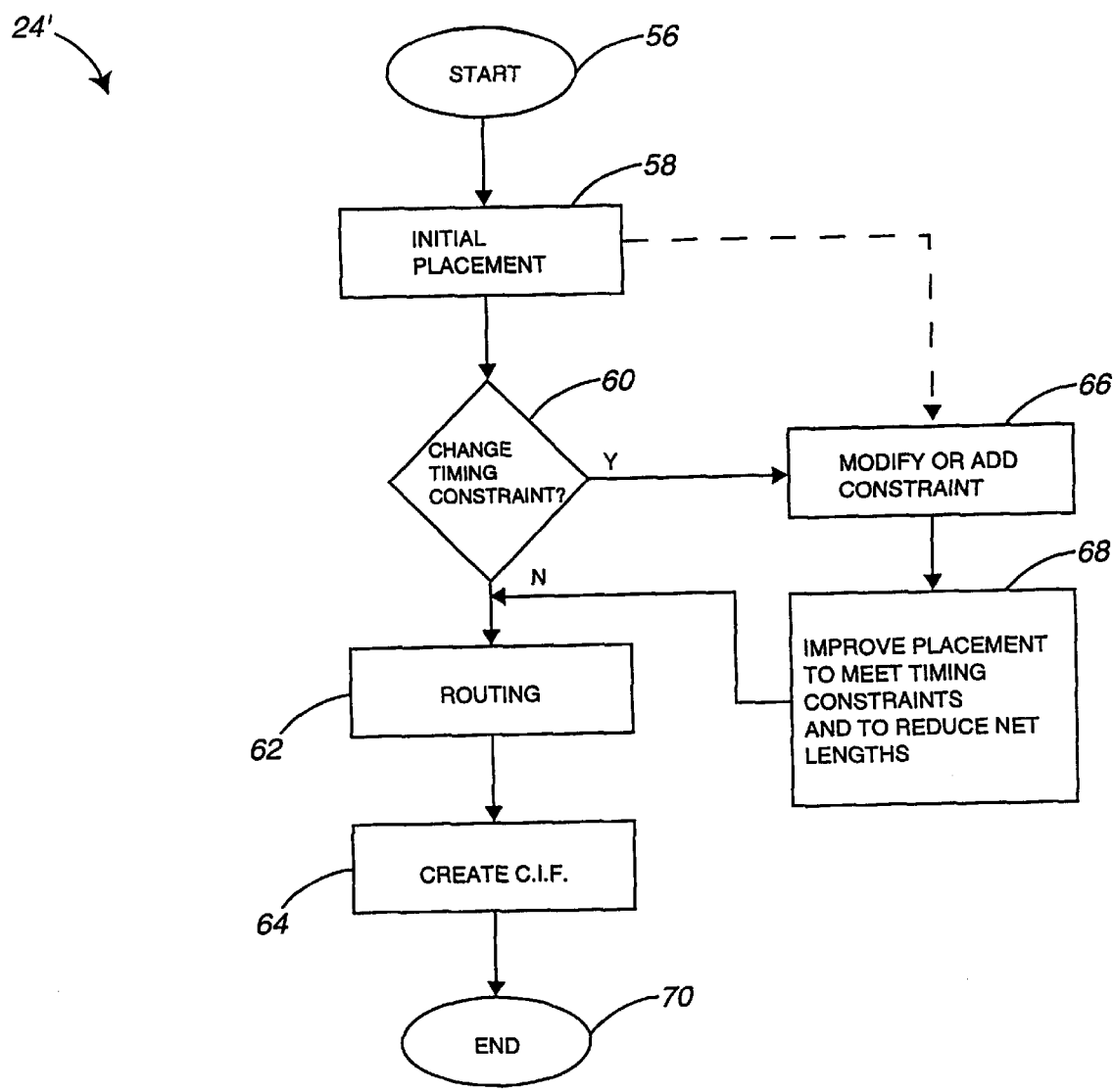
FIG. 3 is a process flow diagram illustrating a layout process in accordance with the present invention.

FIG. 3 illustrates a "layout tool" or process 24' for laying out an integrated circuit in accordance with the present invention. This process 24' replaces the step 24 of the prior art process 10 (see FIG. 1) for fabricating an integrated circuit. Process 24' begins at 56 and, in a step 58, an initial "placement" process is implemented. This placement process can be any conventional placement process known in the prior art. Next, in a step 60, it is determined whether timing verifies, i.e. whether timing constraints have been met. The various forms of timing constraints will be discussed in greater detail subsequently. If step 60 determines that timing does verify, a "routing" process is executed in step 62. Again, the routing process can be any conventional routing process or tool known to those skilled in the art. The resulting placed and routed circuit is then converted into C.I.F. format in a conventional step 64, and the process is completed at 66.

If step 60 determines that timing does not verify, an Engineering Change Order (ECO) process begins. More specifically, in a step 66 a designer modifies the netlist in order to modify or add one or more cells to achieve the desired timing constraints. After the netlist is modified as necessary, the ECO placement improvement process or "ECO placement improvement tool" 68 of the present invention properly places the new and/or modified cells by taking into account timing constraints while minimizing overall net length. Process control then proceeds to step 62.

Alternatively, step 60 may be eliminated from the layout process. Specifically, the logic may proceed from the placement process in step 58 directly to the process of modifying the netlist in order to achieve desired timing constraints in step 66.

Figure 4:
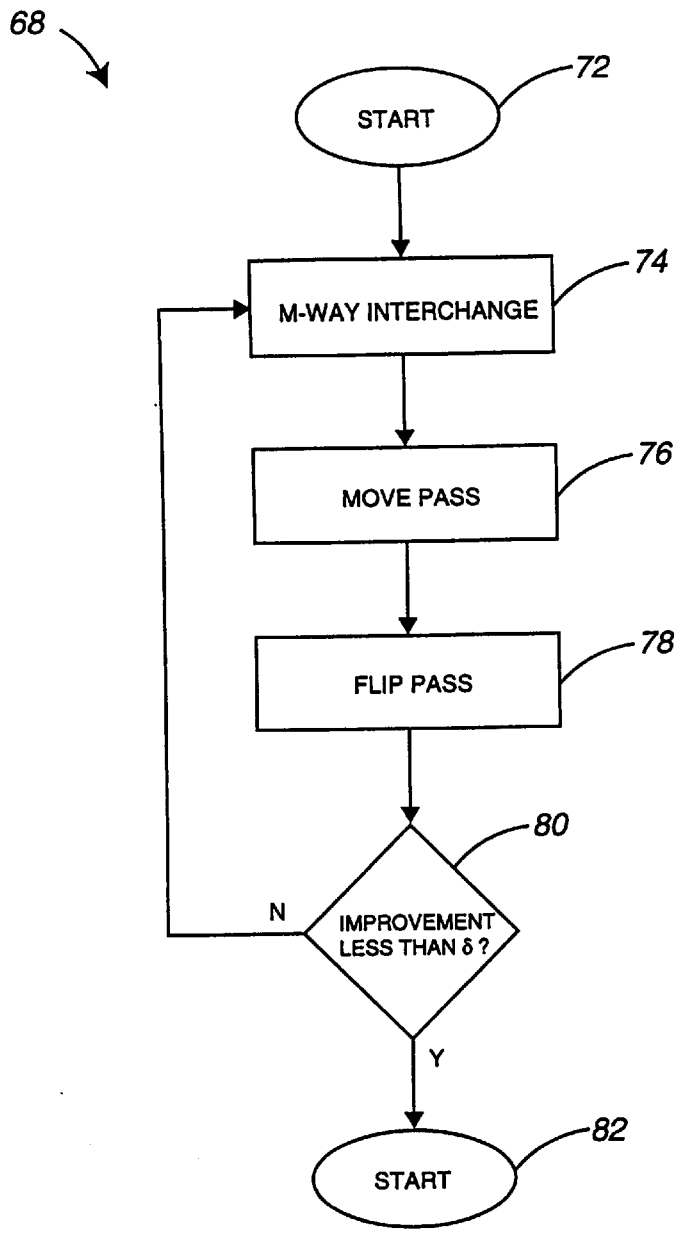
FIG. 4 is a process flow diagram illustrating the "IMPROVE PLACEMENT" step of FIG. 3.

FIG. 4 illustrates the ECO placement improvement process 68 in greater detail. However, before the process 68 is discussed, it will be convenient define certain terminology, conventions, and nomenclature as follows:

Definitions

Target Window

A "target window" of an unplaced cell "$\mu^u_i$" with respect to all the placed cells "$\mu^p_j$" is a region $W_i=(l_i, b_i, r_i, t_i)$ on the layout area such that placing $\mu^u_i$ in any location inside $W_i$ will result in a minimum net length of all the nets in $N(\mu^u_i)$. The parameters $(l_i,r_i)$ and $(b_i,t_i)$ are called "x-span" and "y-span", respectively, of the target window.

Bounding Box

A "bounding-box" of a net $N_i \in N$, $B(N_i)$, is defined by the minimum rectangle enclosing all the pins to which the net $N_i$, is connected. The net length of $N_i$, $L(N_i)$, is estimated by the half-perimeter length of $B(N_i)$, i.e. two adjacent sides of the bounding box. Therefore, if $L_x(N_i)$ and $L_y(N_i)$ are lengths in x and y directions, respectively, then $L(N_i)=L_x(N_i)+L_y(N_i)$.

Multiset

A "multiset" is, like a set, a collection of elements; however, unlike a set, a multiset can have multiple occurrences of the same element.

Overview of ECO Placement Improvement Process

The timing constraints, as well known to those skilled in the art, are often specified in three different ways: (1) using critical paths; (2) using net weights; and (3) specifying maximum capacitance on nets. A "critical path" is defined by a sequence of "net pins" (i.e. pins of cells that are connected by a net) and net "edges" between the pins. As used herein, an "edge" of a net is the connection between any two pins of that net. The timing constraint is the maximum allowed delay on the critical path. The ECO placement improvement process 68 of the present invention places and replaces modified and/or new cells in a way such that the delay constraints are met. The edges on a path belong to different nets and, to meet the timing constraints, the cells on those nets are to be placed close to each other. During placement, this is achieved by assigning variable weights to nets on a critical path.

In FIG. 4, an ECO placement improvement process 68 in accordance with the present invention begins at 72, and, in a step 74, performs an m-way interchange process. After the completion of the m-way interchange of step 74, a move pass process is performed in a step 76. Next, in a step 78, a flip pass process is performed. In a step 80, a determination is made as to whether timing constraints have been met to within a suitable limit δ provided by the system designer or operator. For example, δ can be approximately one percent. If timing does not verify, process control returns to step 74, and steps 74–80 are repeated until timing constraints have been met to within the suitable limit δ, i.e. the improvement is less than δ. When it is determined in step 80 that timing constraints have been suitably met, the process is completed at 82.

The ECO placement improvement process 68 may be considered to be an iterative improvement algorithm. That is, the ECO placement improvement process 68 iteratively modifies the existing placement of modules to achieve better quality placement. This iterative process does not conclude until timing constraints have been met to within a suitable limit defined as δ. When timing constraints have been met to within a suitable limit δ, placement is considered to be "optimized." In some preferred embodiments, δ may be defined as being approximately one percent. In other embodiments, δ can be in the range of approximately 0.2%<δ<5. The ECO placement improvement process 68 is such that it may be used for both row-based and non-row-based designs.

Figure 5:
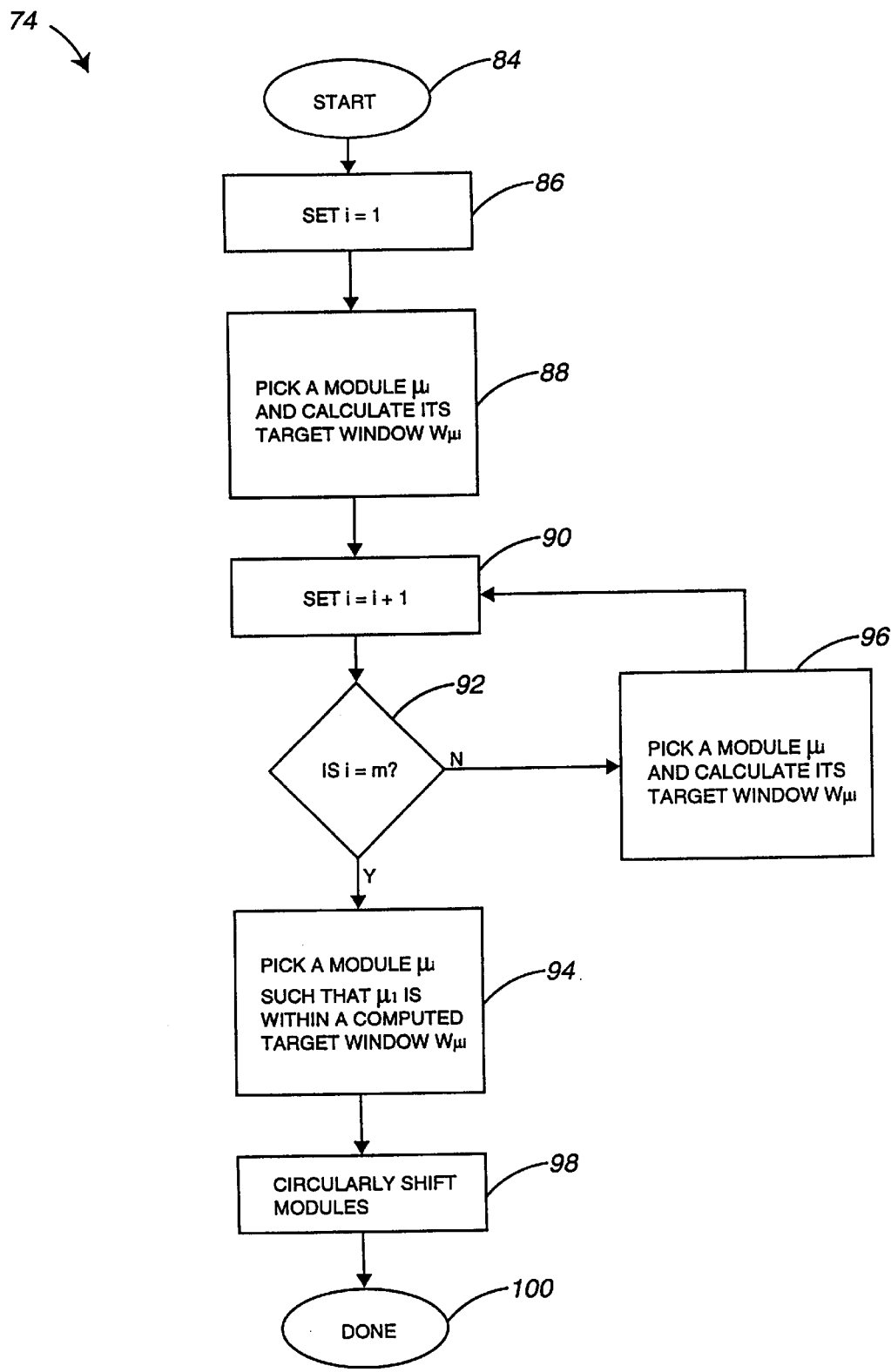
FIG. 5 is a process flow diagram illustrating the "M-WAY INTERCHANGE" step of FIG. 4.

FIG. 5 illustrates the m-way interchange process in greater detail. The m-way interchange process involves interchanging placement locations of m modules. The present invention utilizes a mathematical model to accomplish this process. For a cell, or module, $\mu_i \epsilon M_1$, where $M_1 = \{\mu_1, \mu_2, \ldots, \mu_n\}$ defines a set of cells to be placed, $W_{\mu_i}$ is the target window for $\mu_i$. The placement location of module $\mu_i$ is denoted as $(x_i, y_i)$. Each interchange involves m modules from $M_1$. An injective function $\sigma_I$: $\{1, 2, 3, \ldots, m\} \rightarrow \{1, 2, 3, \ldots, n\}$ for $$1 \leq I \leq \binom{n}{m}$$

is defined to select an ordered list of m modules $(\mu_{\sigma_I(1)}, \mu_{\sigma_I(2)}, \ldots, \mu_{\sigma_I(m)})$ from $M_1$. The m-way interchange problem is to compute a $\sigma_I$ for $$1 \leq I \leq \binom{n}{m}$$

such that $\mu_{\sigma_I(i)}$ is located inside $W_{\sigma_I(i-1)}$ for $2 \leq i \leq m$ and $\mu_{\sigma_I(1)}$ is located inside $W_{\sigma_I(m)}$. Once the ordered list of cells in found, $\mu_{\sigma_I(i)}$ is placed in the placement location denoted as $(x_{\sigma_I(i+1)}, y_{\sigma_I(i+1)})$ for $1 \leq i \leq m-1$, and $\mu_{\sigma_I(m)}$ is placed in the placement location denoted as $(x_{\sigma_I(1)}, y_{\sigma_I(1)})$. Placement locations in target windows are located such that by placing a module $\mu_{\sigma_I(i)}$ in a desired placement location $(x_{\sigma_I(1)}, y_{\sigma_I(1)})$, the result is a reduced net length for the module $\mu_{\sigma_I(i)}$.

The process of m-way interchange in accordance with the present invention begins at 84 and, in a step 86, a variable counter i is initialized to a value of one. Next, in a step 88, a module, or cell, $\mu_i$ is picked, and a target window $W_{\mu_i}$ for module $\mu_i$ is calculated. The process of calculating target windows will be discussed in detail subsequently. In a step 90, the variable counter i is incremented by one, and process control proceeds to a step 92 which is a determination of whether the variable counter i is equal to the number of modules m. In other words, step 92 determines whether all of the modules which are to be interchanged have been processed. If step 92 determines that the processing of all of the modules which are to be interchanged is incomplete, the next module $\mu_i$ to be processed is picked, and a corresponding target window $W_{\mu_i}$ is calculated in a step 96. Then, process control returns to step 90, and steps 90–96 are repeated until the determination is made in step 92 that all modules which are to be interchanged have been processed. When the determination is made in step 92 that all modules which are to be interchanged have been processed, a module $\mu_i$ is picked such that a module $\mu_1$ is within a computed target window $W_{\mu_i}$ in a step 94. All modules are then circularly shifted in a step 98, and the process of m-way interchange is completed at 100.

A special case of m-way interchange occurs when the number of modules m is equal to two; this special case is known as a pair-wise interchange. In pair-wise interchange, two modules are selected to interchange their placement locations such that each one is within the target window of the other.

Figure 5A:
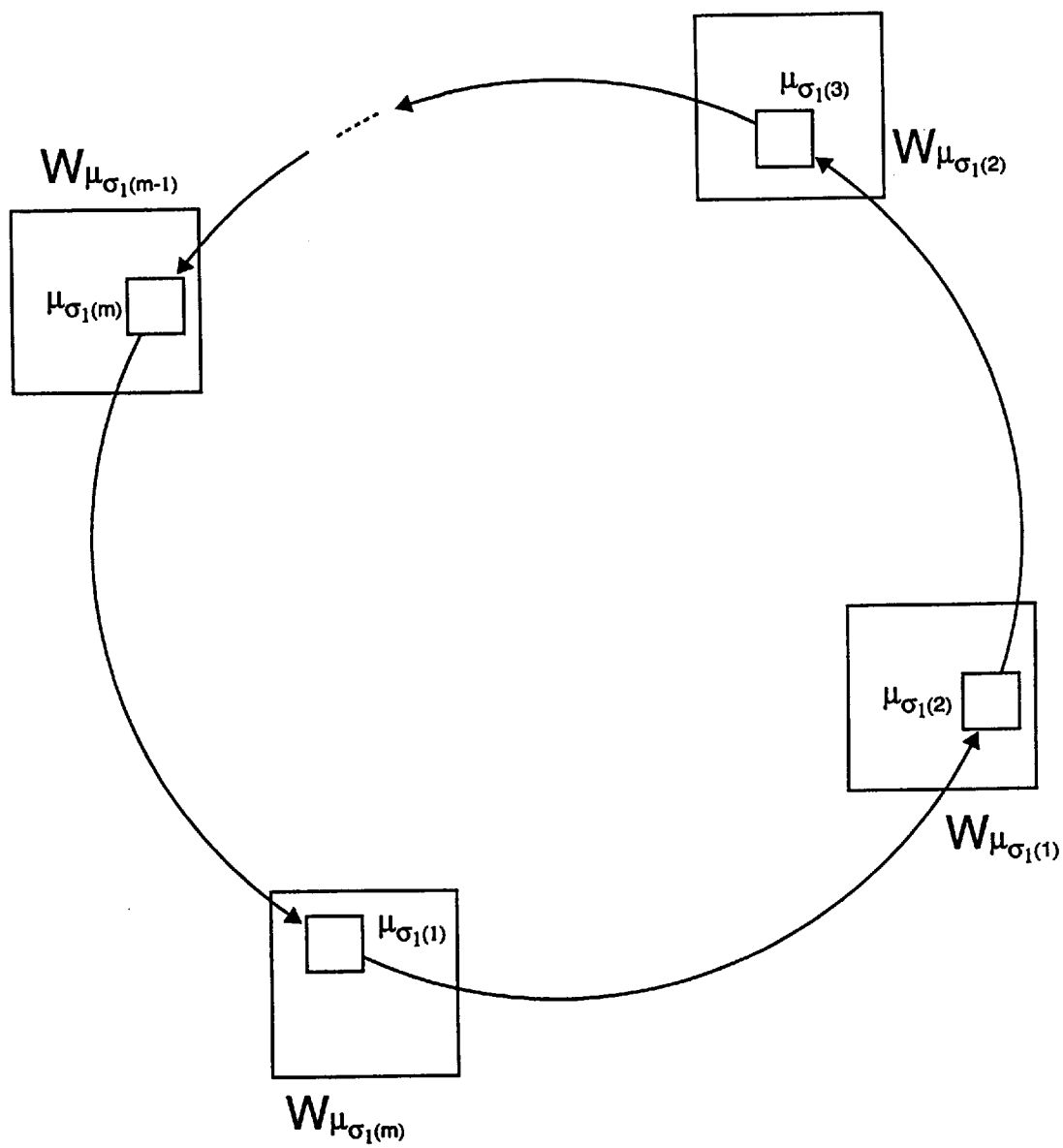
FIG. 5a is a diagram used to illustrate the process of FIG. 5.

FIG. 5a illustrates an example of m-way interchange. The arrows denote the direction in which modules are circularly shifted. By "circularly shifted" it is not meant that the modules are circularly arranged, but, rather, that they are shifted in a closed loop of some type. Target windows are defined such that for i less than the number of modules m to be interchanged, module $\mu_{\sigma_I(i+1)}$ is initially located within target window $W_{\sigma_I(i)}$, prior to the circular shifting of the modules. Module $\mu_{\sigma_I(m)}$ is picked such that module $\mu_{\sigma_I(1)}$ is located within target window $W_{\sigma_I(m)}$. When modules are circularly shifted, module $\mu_{\sigma_I(1)}$ is moved to a placement location within target window $W_{\sigma_I(1)}$. Similarly, module $\mu_{\sigma_I(i)}$ is moved to a placement location within target window $W_{\sigma_I(i)}$. At the end of an m-way interchange, each of the m modules which has been shifted is in a neutral location within a target window corresponding to each modules. Hence, the total net length of the overall circuit is decreased.

Figure 6:
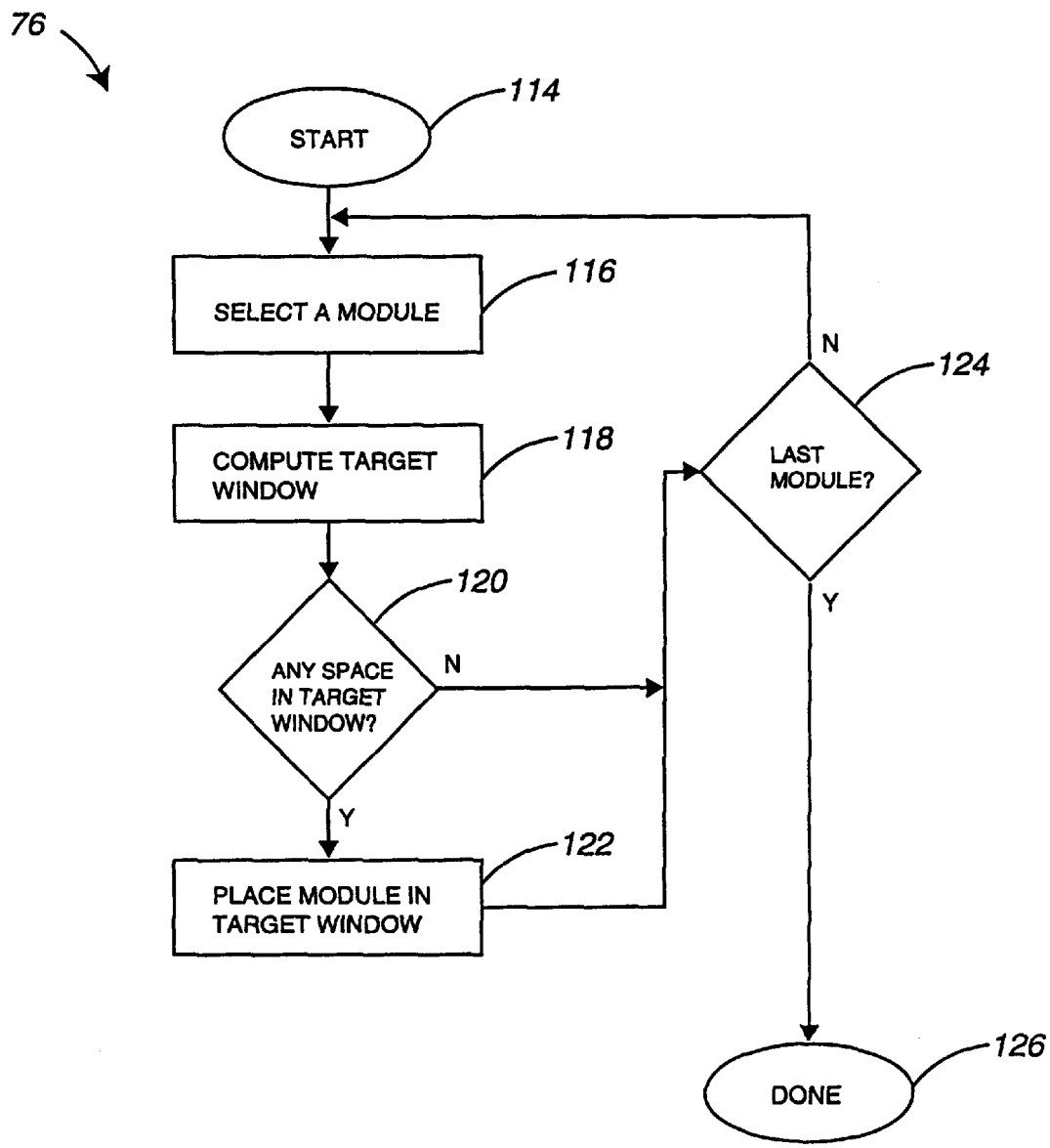
FIG. 6 is a process flow diagram illustrating the "MOVE PASS" step of FIG. 4.

FIG. 6 illustrates the move pass process in greater detail. A target window for a module, as previously discussed, gives a region on the layout area such that placing modules in any location inside the target window results in a reduced net length. The move pass process involves moving a module into a target window when space is available in the target window.

More particularly, with continuing reference to FIG. 6, a move pass process in accordance with the present invention begins at 114 and, in a step 116, a module is selected from a group of modules which will undergo the move pass process. A target window for the selected module is calculated in a step 118. If step 120 determines that there is no available space in the target window, process control moves to a step 124 where it is determined whether there are any more modules remaining to be processed. If step 120 determines that there is available space in the target window, a step 122 places the module in the target window, then process control proceeds to step 124. If it is determined in step 124 that there are additional modules to be processed, process control returns to step 116, and steps 116–124 are repeated until the determination is made in step 124 that the last module has been processed. When the last module has been processed, the move pass process is completed at 126.

Figure 7:
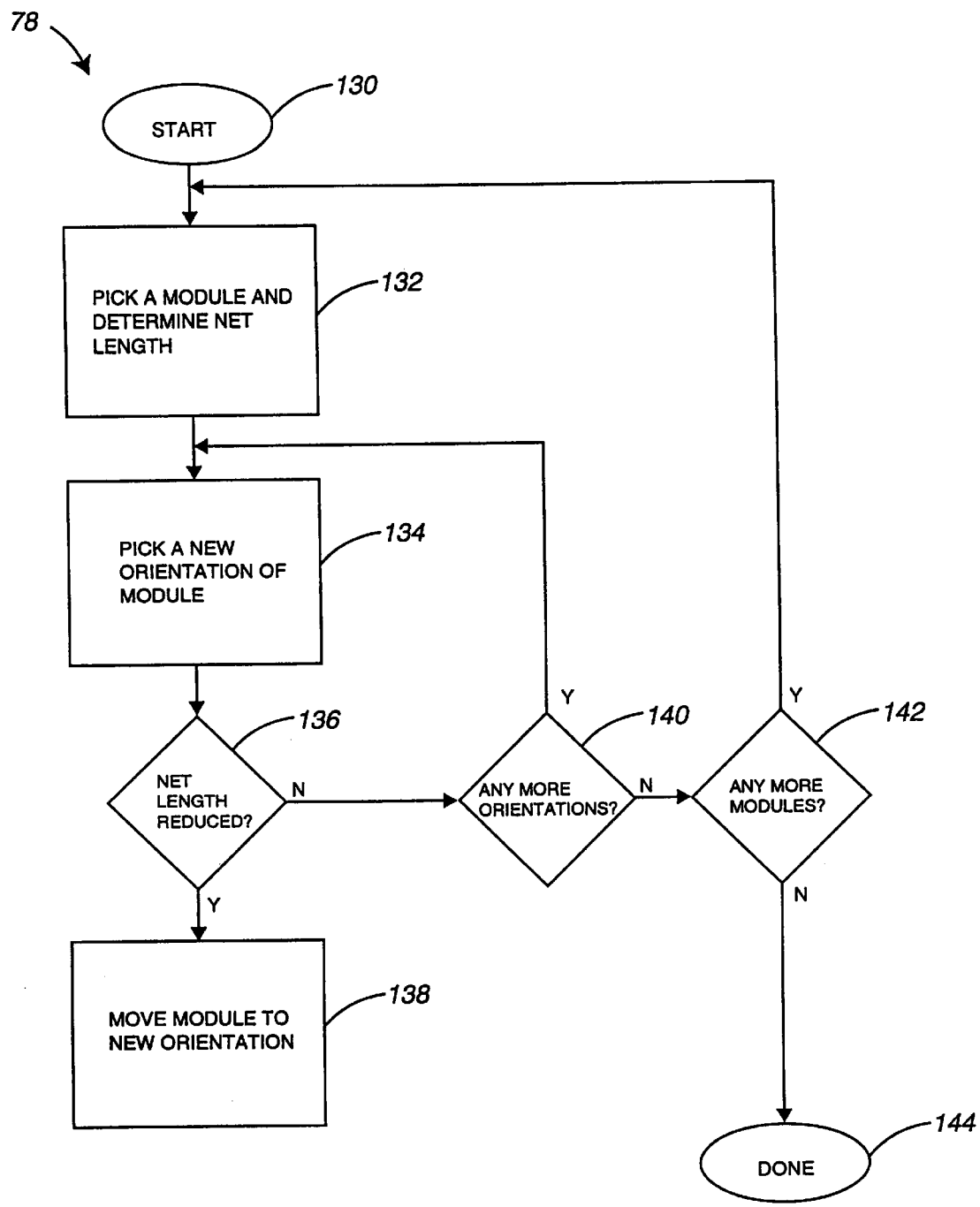
FIG. 7 is a process flow diagram illustrating the "FLIP PASS" step of FIG. 4.

FIG. 7 illustrates the flip pass process in greater detail. Each module which undergoes the flip pass process is "flipped" in the same location in an effort to reduce total net length. By "flipping" it is meant that the module is rotated 180 degrees with respect to the plane of the layout such that a left and a right edge are reversed, a top. and a bottom edge are reversed, etc. If flipping a module results in a reduced net length, then the flip is accepted, otherwise, the flip is rejected. Typically, there is a maximum of eight possible orientations, although some designs may not support all eight orientations. The eight orientations, with reference to an edge of a module, may be realized by having the module on the "top" surface of an IC with the referenced edge facing left, right, up, or down, while parallel to a side of the IC, and having the module on the "bottom" surface of an IC, again with the reference edge facing left, right, up, or down, while parallel to a side of the IC. The "top" surface and the "bottom" surface of an IC may be defined as the two surfaces of the IC.

More particularly, and with continuing reference to FIG. 7, a flip pass process in accordance with the present invention begins at 130 and, in a step 132, a module is selected and the net length of the selected module is determined. A new orientation for the module is selected from a group of possible orientations in a step 134. If step 136 determines that the net length of the selected module is reduced by the new orientation, the module is moved to the new orientation in a step 138. If step 136 determines that the net length is not reduced by placing the module in the new orientation, process control proceeds to a step 140 where it is determined whether there are any other orientations for the module. If step 140 determines that there are more orientations, process control returns to step 134, and steps 134–140 are repeated either until it is determined in step 136 that the net length is reduced by a new orientation, or until there are no more possible orientations for the selected module. If it is decided in step 140 that there are no more possible orientations for the selected module, a determination is made in a step 142 as to whether any more modules are to undergo the "flip pass" process. If step 142 determines that there are more modules to process, process control returns to step 132, and steps 132–142 are repeated until either the net length is determined to be reduced in step 136, thereby resulting in the module being moved to a new orientation in step 138, or it is determined in step 142 that there are no more modules to process, in which case the flip pass process is completed at 144.

Figure 8:
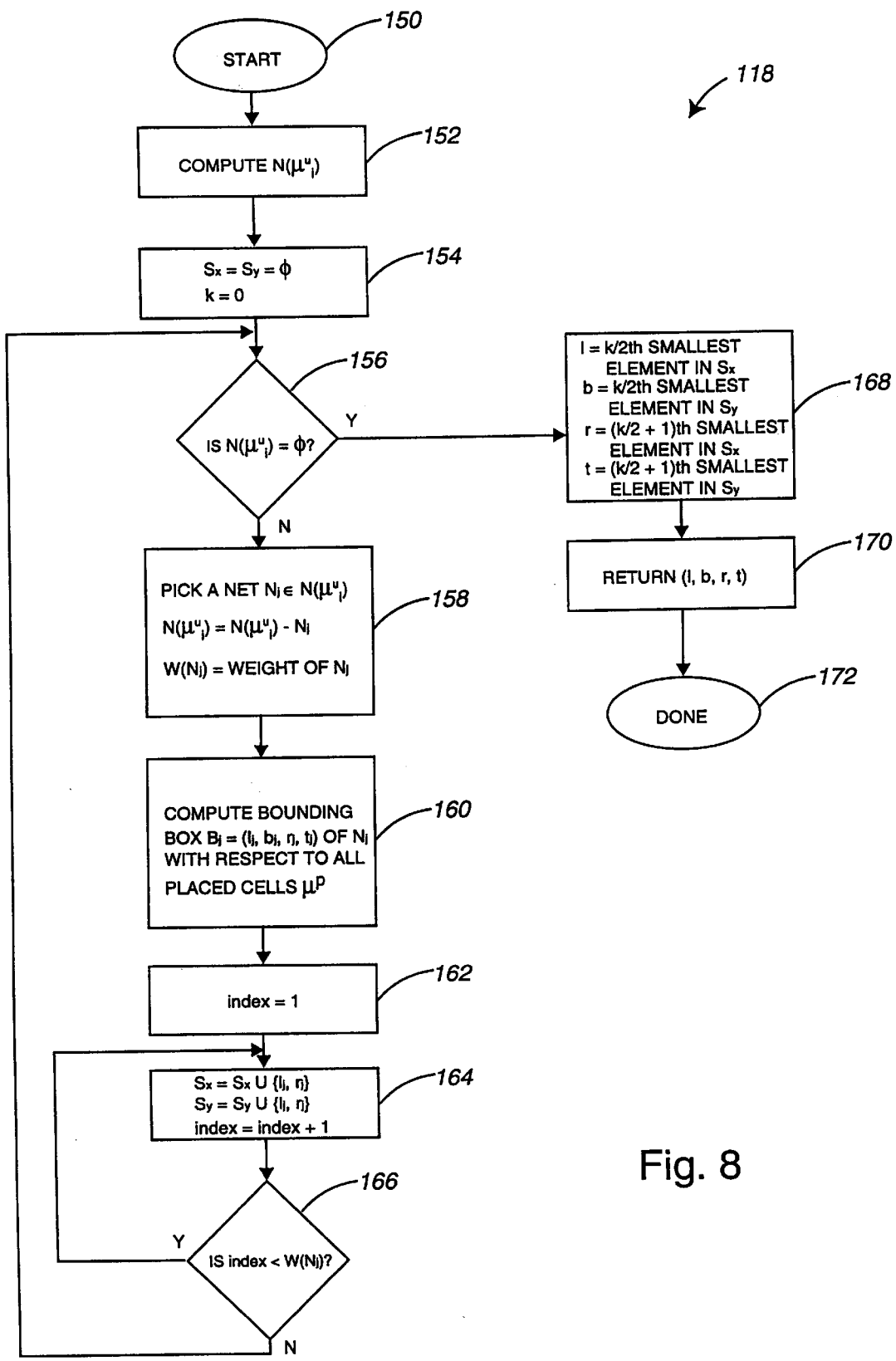
FIG. 8 is a process flow diagram illustrating the step of computing a target window.

In FIG. 8, the step of computing a target window is illustrated in greater detail. The present invention utilizes a mathematical model to accomplish this step. For an unplaced cell $\mu^u_i \in M_2$, where $M_2 = \{\mu^u_1, \mu_{u2}, \ldots, \mu^u_{m2}\}$ defines a set of new unplaced cells, $N(\mu^u_i)$ is defined as the set of nets with a pin on $\mu^u_i$. A single net $N_j$ is a subset of the set of nets, i.e. a net $N_j \in N(\mu^u_i)$. The net length of $N_j$ can be viewed as a function of the placement location of $\mu^u_i$. In the following descriptions, $L_x(N_j)$ and $L_y(N_j)$ are x-length and y-length functions, respectively for $N_j$.

Figure 8A:
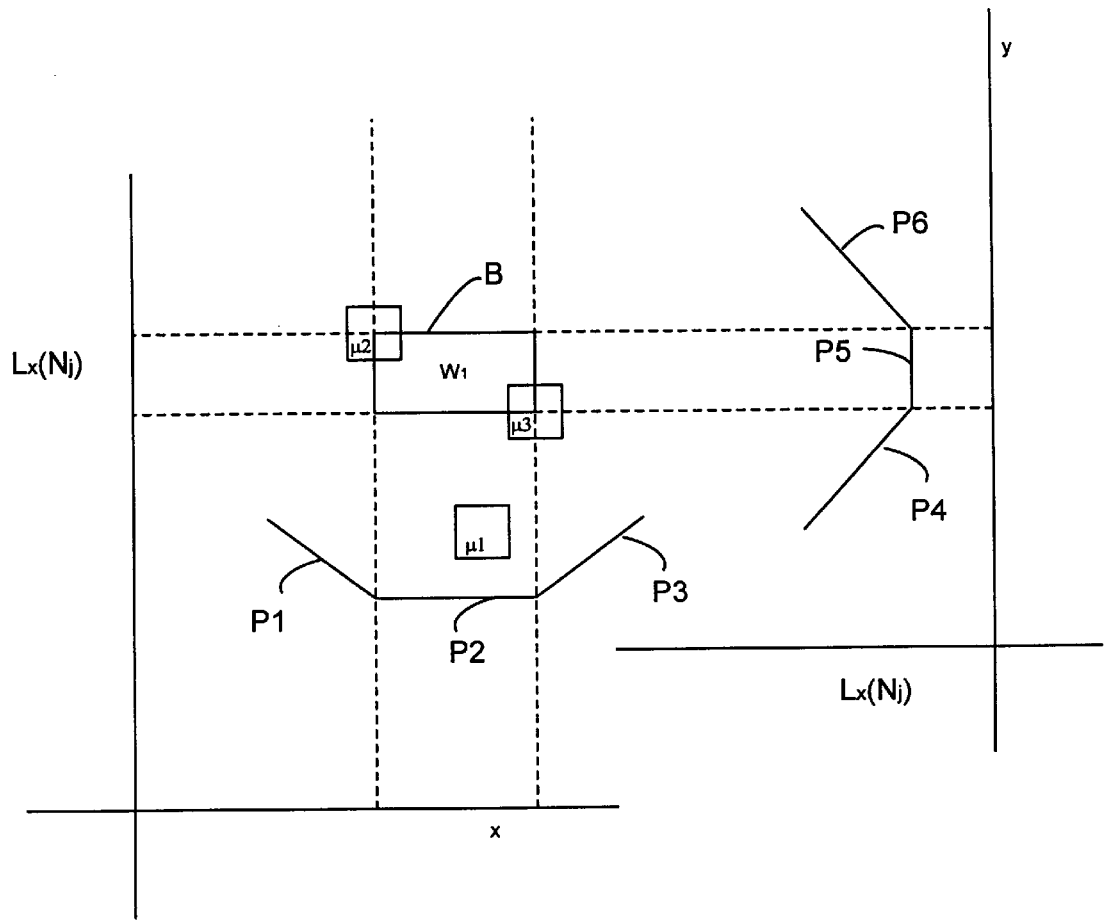
FIG. 8a is diagram used to illustrate the process of FIG. 8.

FIG. 8a illustrates an example of such functions for a net which connects three cells $\mu_1, \mu_2,$ and $\mu_3$. Again, these cells represent components of the integrated circuit, and include "pins" that are to be interconnected by a net to form a common potential node. The two functions in the present example are with respect to the placement location of cell $\mu_1$. It can be seen that the net length will be minimized if $\mu_1$ is placed within the bounding box "B" enclosing $\mu_2$ and $\mu_3$. If $\mu_1$ is placed in any location outside the bounding box "B", the net length will increase linearly.

These type of functions are known as "piece-wise linear unimodal" functions, and are well known to those skilled in the art. The various "pieces" are shown at P1, P2, P3, P4, P5, and P6 in FIG. 8a. If, $N_j$ is the net that connects $\mu_1, \mu_2,$ and $\mu_3$ together, then P1, P2, and P3 collectively define the x-length function $L_x(N_j)$ of $N_j$, and P4, P5, and P6 define the y-length function $L_y(N_j)$ of $N_j$.

As is well known to those skilled in the art, the sum of a set of piece-wise linear unimodal functions is also a piece-wise linear unimodal function. If $L_x(N(\mu^u_i))$ is the x-length function for all the nets in $N(\mu^u_i)$, it is easy to see that $L_x(N(\mu^u_i)) = \Sigma_{N_j \in N(\mu^u_i)} L_x(N_j)$ and is a piece-wise linear unimodal function. The domain of values for which function $L_x(N(\mu^u_i))$ gives the minimum value, is the x-span of the target window for the cell $\mu^u_i$. This is also called the domain of minimum of the function. Similarly, the domain of values for which function $L_y(N(\mu^u_i))$ gives the minimum value is the y-span of the window for the cell $\mu c^u_i$.

For a net $N_j \in N(\mu^u_i)$, if $B_j = (l_j, b_j, r_j, t_j)$ is the bounding box of $N_j$ with respect to all the placed cells, then it can be seen that $(l_j, r_j)$ is the domain of minimum of $L_x(N_j)$, and $(b_j, t_j)$ is the domain of minimum of $L_y(N_j)$. This is due to the fact that if $\mu^u_i$ is placed anywhere outside $B_j$, the net length of $N_j$ will increase. Therefore, if $\mu^u_i$ is connected to only $N_j$, then $B_j$ will give us the target window. In case $\mu^u_i$ is connected to more than one net, we still can use the bounding box of each net to get the target window for $\mu^u_i$.

Referring again to FIG. 8, the process of calculating a target window for a module in accordance with the present invention begins at 150 and, in a step 152, $N(\mu^u_i)$ is computed. Next, in a step 154, the sets $S_x$ and $S_y$ are set to null ("$\phi$"), and the counter "k" is set to zero. A decision step 156 determines if the set $N(\mu^u_i)$ is null. If the determination is that the set $N(\mu^u_i)$ is not null, a step 158 picks a net $N_j \in N(\mu^u_i)$, and then removes the selected net from the set $N(\mu^u_i)$. As noted, the weight $w(N_j)$ of $N_j$ is provided. Next, in a step 160, the bounding box B is computed as $B_j = (l_j, b_j, r_j, t_j)$ of net $N_j$ with respect to all placed cells. Next, a step 162 assigns the counter "index" the value of 1, and a step 164 assigns $S_x = S_x \cup \{l_j, r_j\}$ and $S_y = S_y \cup \{b_j, t_j\}$. Step 164 also iterates the counter "index" by one. A decision step 166 determines whether "index" is less than the weight $w(N_j)$ and, if it is, step 164 is repeated until "index" is greater than or equal to the weight $w(N_j)$, at which time process control returns to step 156.

When step 156 determines that set $N(\mu^u_i)$ is null, i.e. all nets have been removed from the set, a step 168 defines the parameters l, b, r, and t as follows:

l=k/2th smallest element in $S_x$ b=k/2th smallest element in $S_y$ r=(k/2+1)th smallest element in $S_x$ t=(k/2+1)th smallest element in $S_y$ These parameters define the boundaries of the target window $W_i$ of the cell $\mu^u_i$.

More specifically, l, b, r, and t are the left, bottom, right, and top boundaries, respectively, of target window $W_i$. Finally, in a step 170, these parameters l, b, r, and t are returned to be used by the mapping process as previously described.

The process or computing a target window is further illustrated in the procedure listed in TABLE 1, below. This procedure is written as "pseudo code", as will be appreciated by those skilled in the art. Actual software or "code" implementing the pseudo code is preferably provided as a callable function TARGET_WINDOW during the implementation of the process of the present invention. The sets $S_x$ and $S_y$ are multisets and are used to store the x- and y-values of the bounding box of different nets.

TABLE 1

PROCEDURE TARGET WINDOW procedure TARGET_WINDOW($c^u{}_i$)
1. compute $N(\mu^u{}_i)$.
2. Let $S_x = \phi$; $S_y = \phi$.
3. Let $k = 0$
4. for each net $N_j \in N(\mu^u{}_i)$ do
    4.1. compute the bounding box $B_j = (l_j,b_j,r_j,t_j)$ of net $N_j$ with respect to all placed cells.
    4.2. Let $w(N_j)$ be the weight of $N_j$.
    4.3. for $i = 1$ to $w(N_j)$ do
        4.3.1. $S_x = S_x \cup \{l_j,r_j\}$
        4.3.2. $S_y = S_y \cup \{b_j,t_j\}$
    4.4. $k = k + 2*w(N_j)$
5. Let $l = k/2th$ smallest element in $S_x$
   Let $b = k/2th$ smallest element in $S_y$
   Let $r = (k/2 + 1)th$ smallest element in $S_x$
   Let $t = (k/2 + 1)th$ smallest element in $S_y$
6. return $(l,b,r,t)$;

Note that the value of k in procedure TARGET_WINDOW is the total number of elements in $S_x$ and $S_y$, and is always even. It will be appreciated by those skilled in the art that the k/2th and (k/2+1)th values in $S_x$ give the x-span of the target window. Similarly, the k/2th and (k/2+1)th values in $S_y$ give the y-span of the target window. Since the timing constraints are provided in the form of net weights, this procedure satisfies the timing requirements by minimizing weighted net length during the target window computation.

The computational complexity of the procedure is dominated by step 4 (i.e. the iterative loop comprising steps 4.1–4.4) of the procedure TARGET_WINDOW of Table 1, the complexity being designated as O(n), where n is the total nets connected to the given cell. As is well known to those skilled in the art, "O" is used to specify the order of time complexity in the execution of procedures, such as the pseudo-code procedure listed above. In this particular instance, O(n) simply indicates that the loop of step 4 is executed "n" times. The loop of step 4.3 is executed $w(N_j)$ times that is, in the worst case, the time complexity of this loop is O(k), where k is the maximum weight of a net. Therefore the overall time complexity of the procedure is O(kn), where k is the maximum weight of a net and n is the maximum number of nets connected to a cell.

Since weights are provided to the procedure and are set according to the timing constraints as mentioned previously, we can assume the weights to be constant. Thus the time complexity of the procedure is O(n). In practice, on the average each cell is connected to at most 5 or 6 nets. Therefore, the procedure of the present invention calculates the target window of a cell very quickly and efficiently.

Once a target window is found by the procedure TARGET_WINDOW, the cell is placed ("mapped") inside the target window. The actual mapping step will depend upon the IC technology being used, as will be appreciated by those skilled in the art of custom and semi-custom IC fabrication.

Experimental Results

FIG. 9a is a table of different row-based circuits used in testing the ECO placement improvement process in accordance with the present invention. The number of cells, the number of nets, and the number of pads are specified in the table of FIG. 9a.

FIG. 9b is a table of results generated for different circuits using a "Domino" layout process and the layout process in accordance with the present invention. Since the "Domino" layout process may only be used for row-based designs, whereas the present invention may be used for both row-based and non-row-based designs, a comparison may only be made of the results of both algorithms as used for the row-based designs of FIG. 9a. As shown in FIG. 9b, the results obtained with the present invention generally result in a shorter net length as well as a shorter processing time than the results obtained through using the "Domino" layout process. The present invention is as much as eight times faster than the "Domino" layout process. For the cases in which the net lengths obtained through using present invention are longer than the net lengths obtained through using "Domino," it should be noted that the processing times for the present invention are significantly lower than those for "Domino." It should further be noted that the net lengths obtained using the present invention show a marked improvement over the initial net lengths.

While this invention has been described in terms of several preferred embodiments, there are alterations, permutations, and equivalents which fall within the scope of this invention. It should also be noted that there are many alternative methods of implementing both the process and apparatus of the present invention. It is therefore intended that the following appended claims include all such alterations, permutations, and equivalents as fall within the true spirit and scope of the present invention.

We claim:

1. A method for laying out an integrated circuit design based upon a netlist provided by a behavioral synthesis tool, said method comprising:

placing cells specified by said netlist in a layout area in a placement step, said cells including pins that are interconnected by nets;

verifying timing constraints in a timing verification step of said placed cells in said layout area; and if said timing verification step indicates that timing does not verify in that said timing constraints are not met:

modifying said netlist pursuant to an engineering change order (ECO); and making an ECO placement of at least one cell into said layout area by:

(1) picking an unplaced cell from a set of unplaced cells to be a picked cell;

(2) determining a target window within said layout area for the placement of said picked cell;

(3) mapping said picked cell inside said target window;

(4) removing said picked cell from said set of unplaced cells;

(5) optimizing the placement of said picked cell by analyzing said picked cell within said target window with respect to said placed cells, and modifying said placement of said picked cell with respect to said placed cells if modifying said placement of said picked cell improves timing; and (6) repeating steps (1)–(5) until said set of unplaced cells is empty wherein said optimizing the placement of said picked cell includes performing an m-way interchange;

wherein said m-way interchange includes:

determining a closed loop pattern of m windows;

moving cells either clockwise or counter-clockwise within said closed loop pattern;

calculating said target window for said picked cell;

picking an additional cell and calculating a target window for said additional cell until a predetermined number of additional cells has been picked;

picking a last additional cell and calculating a target window for said last additional cell such that said picked cell is within said target window for said last additional cell; and, moving said picked cell, said additional cells, and said last additional cell either clockwise or counter clockwise within said closed loop pattern; and moving cells either clockwise or counter clockwise within said closed loop pattern.

2. A method for laying out an integrated circuit design based upon a netlist provided by a behavioral synthesis tool, said method comprising the steps of:

(A) placing cells specified by said netlist in a layout area in a placement step, said cells including pins that are interconnected by nets;

(B) verifying timing constraints in a timing verification step of said placed cells in said layout area; and (C) if said timing verification step indicates that timing does not verify in that said timing constraints are not met:

(a) modifying said netlist pursuant to an engineering change order (ECO); and (b) making an ECO placement of at least one cell into said layout area by:

(1) picking an unplaced cell from a set of unplaced cells to be a picked cell;

(2) determining a target window within said layout area for the placement of said picked cell;

(3) mapping said picked cell inside said target window;

(4) removing said picked cell from said set of unplaced cells;

(5) optimizing the placement of said picked cell by analyzing said picked cell within said target window with respect to said placed cells, and modifying said placement of said picked cell with respect to said placed cells if modifying said placement of said picked cell improves timing; and (6) repeating steps (1)–(5) until said set of unplaced cells is empty.

3. A method as recited in claim 2 wherein said step of determining said target window involves determining a minimum bounding box that encloses pins connected by nets of cells within the set of unplaced cells.

4. A method as recited in claim 3 wherein said step of determining said target window further involves using weights assigned said nets of said set of unplaced cells, said weights being related to timing constraints of said integrated circuit design.

5. A method as recited in claim 4 wherein said mapping step for a gate array includes the steps of:

mapping said cell to an empty site in said target window, if one exists; and if no empty site exists in said target window, mapping said cell to a site in said window that would exhibit a minimum of overlap with adjacent cells, and moving any overlapped adjacent cells locally within the layout area until the overlap has been eliminated.

6. A method as recited in claim 4 wherein said mapping step for a standard cell includes the steps of:

mapping said cell to a row of cells within said window;

pushing any cells in that row to remove any overlap; and if said row no longer fits within the target window, removing a cell from said row and placing it in another row.

7. A method as recited in claim 2 wherein said step of optimizing the placement of said picked cell includes at least one of an m-way interchange, a move pass, and a flip pass, wherein:

said m-way interchange includes determining a closed loop pattern of m windows, and moving cells either clockwise or counter clockwise within said closed loop pattern;

said move pass includes moving said picked cell into an available target window other than said target window; and said flip pass includes re-orienting said picked cell within said target window.

8. A method as recited in claim 7 wherein said step of optimizing includes two or more of said m-way interchange, said move pass, and said flip pass.

9. A method as recited in claim 8 wherein said step of optimizing includes:

(a) performing an m-way interchange, a move pass, and a flip pass;

(b) performing a timing verification;

(c) determining the amount of timing improvement due to step (a); and (d) repeating steps (a)–(c) if the timing improvement is greater than a predetermined value.

10. A method as described in claims 7, wherein said m-way interchange includes the steps of:

(a) calculating said target window for said picked cell;

(b) picking an additional cell and calculating a target window for said additional cell until a predetermined number of additional cells has been picked;

(c) picking a last additional cell and calculating a target window for said last additional cell such that said picked cell is within said target window for said last additional cell; and, (d) moving said picked cell, said additional cells, and said last additional cell either clockwise or counter clockwise within said closed loop pattern.

11. A method as described in claim 7, wherein said move pass includes the step of determining whether there is any space available in said available target window.

12. A method as described in claim 7, wherein said flip pass includes the steps of:

(a) determining a net length for said picked cell;

(b) picking a new orientation for said picked cell;

(c) determining a revised net length for said picked cell in said new orientation;

(d) determining whether said revised net length is less than said net length, wherein when said revised net length is not less than said net length, a determination is made as to whether any new additional orientations for said picked cell exist, wherein if said new additional orientations exist, picking said new orientation from said new additional orientations for said picked cell;

(e) repeating steps (c) and (d) until it is determined that said revised net length is less than said net length, wherein if it is determined that said revised net length is less than said net length, said picked cell to is moved to said new orientation.

13. A method for laying out an integrated circuit comprising the steps of:

picking a cell from a set of cells to be a picked cell;

determining a target window within said layout area for the placement of said picked cell;

mapping said picked cell inside said target window;

optimizing the placement of said picked cell by analyzing said picked cell within said target window with respect to other cells, and modifying said placement of said picked cell if it improves timing and reduces total net length; and repeating the preceding steps until no further improvement is desired;

wherein said step of optimizing the placement of said picked cell includes at least one of an m-way interchange, a move pass, and a flip pass, wherein:

said m-way interchange includes determining a closed loop pattern of m windows, and moving cells either clockwise or counter clockwise within said closed loop pattern;

said move pass includes moving said picked cell into an available target window other than said target window; and said flip pass includes re-orienting said picked cell within said target window.

14. A method for laying out an integrated circuit as recited in claim 13 wherein said step of optimizing includes two or more of said m-way interchange, said move pass, and said flip pass.

15. A method for laying out an integrated circuit as recited in claim 14 wherein said step of optimizing includes:

(a) performing an m-way interchange, a move pass, and a flip pass;

(b) performing a timing verification;

(c) determining the amount of timing improvement due to step (a); and (d) repeating steps (a)–(c) if the timing improvement is greater than a predetermined value.

16. A method as described in claim 13, wherein said m-way interchange includes the steps of:

(a) calculating said target window for said picked cell;

(b) picking an additional cell and calculating a target window for said additional cell until a predetermined number of additional cells has been picked;

(c) picking a last additional cell and calculating a target window for said last additional cell such that said picked cell is within said target window for said last additional cell; and, (d) moving said picked cell, said additional cells, and said last additional cell either clockwise or counter clockwise within said closed loop pattern.

17. A method as described in claim 13, wherein said move pass includes the step of determining whether there is any space available in said available target window.

18. A method as described in claim 13, wherein said flip pass includes the steps of:

(a) determining a net length for said picked cell;

(b) picking a new orientation for said picked cell;

(c) determining a revised net length for said picked cell in said new orientation;

(d) determining whether said revised net length is less than said net length, wherein when said revised net length is not less than said net length, a determination is made as to whether any new additional orientations for said picked cell exist, wherein if said new additional orientations exist, picking said new orientation from said new additional orientations for said picked cell;

(e) repeating steps (c) and (d) until it is determined that said revised net length is less than said net length, wherein if it is determined that said revised net length is less than said net length, said picked cell to is moved to said new orientation.

19. An integrated circuit layout tool comprising:

a computer system including a central processing unit (CPU) and memory coupled to said CPU;

means for obtaining a netlist describing an integrated circuit design;

means for placing cells specified by said netlist in a layout area of said integrated circuit design, said cells including pins that are interconnected by nets;

means for verifying timing constraints of said placed cells in said layout area and if said timing constraints are not verified by said means for verifying timing constraints of said placed cells, then:

(a) means for modifying said netlist pursuant to an engineering change order (ECO); and (b) means for making an ECO placement of at least one cell into said layout area based upon said timing constraints while adjusting any affected nets as specified by said netlist, wherein said means for making an ECO placement includes (i) means for picking an unplaced cell from a set of unplaced cells to be a picked cell, and (ii) means for optimizing the placement of said picked cell by analyzing said picked cell with respect to other cells, and modifying said placement of said picked cell if modifying said placement of said picked cell improves timing;

wherein said means for making an ECO placement further comprises:

means for determining a target window within said layout area for the placement of said picked cell;

means for mapping said picked cell inside said target window; and means for removing said picked cell from said set of unplaced cells.

20. An integrated circuit layout tool as recited in claim 19 wherein said means for determining said target window utilizes a minimum bounding box that encloses said pins connected by nets of cells within the set of unplaced cells.

21. An integrated circuit layout tool as recited in claim 20 wherein said means for determining said target window further utilizes weights assigned to said nets of said set of unplaced cells, said weights being related to timing constraints of said integrated circuit design.

22. An integrated circuit layout tool as recited in claim 21 further including means for mapping for a gate array, wherein said means for mapping for a gate array includes:

means for mapping said picked cell to an empty site in said target window, if one exists and, if not, means for mapping said picked cell to a site in said window that would exhibit a minimum of overlap with adjacent cells, and means for moving any overlapped adjacent cells locally within the layout area until the overlap has been eliminated.

23. An integrated circuit layout tool as recited in claim 21 wherein said means for mapping for said picked cell includes:

means for mapping said picked cell to a row of cells within said target window;

means for pushing any cells in that row to remove any overlap; and if said row no longer fits within the target window, means for removing a particular cell from said row and placing it in another row.

24. An integrated circuit layout tool as recited in claim 19 wherein said means for optimizing the placement of said picked cell utilizes at least one of an m-way interchange, a move pass, and a flip pass, wherein:

said m-way interchange includes determining a closed loop pattern of m windows, and moving cells either clockwise or counter clockwise within said closed loop pattern;

said move pass includes moving said picked cell into an available target window other than said target window; and said flip pass includes re-orienting said picked cell within said target window.

25. An integrated circuit layout tool as recited in claim 25 wherein said means for optimizing utilizes two or more of said m-way interchange, said move pass, and said flip pass.

26. An integrated circuit layout tool as recited in claim 25 wherein said means for optimizing includes:

(a) means for performing an m-way interchange, a move pass, and a flip pass;

(b) means for performing a timing verification; and (c) means for determining the amount of timing improvement due to performing said m-way interchange, said move pass, and said flip pass.

27. An integrated circuit layout tool as described in claim 24, wherein said means for m-way interchange includes:

(a) means for calculating said target window for said picked cell;

(b) means for picking an additional cell and calculating a target window for said additional cell until a predetermined number of additional cells have been picked;

(c) means for picking a last additional cell and calculating a target window for said last additional cell such that said picked cell is within said target window for said last additional cell; and, (d) means for moving said picked cell, said additional cells, and said last additional cell either clockwise or counter clockwise within said closed loop pattern.

28. An integrated circuit layout tool as described in claim 24, wherein said means for move pass includes means for determining whether there is any space available in said available target window.

29. An integrated circuit layout tool as described in claim 24, wherein said means for flip pass includes:

(a) means for determining a net length for said picked cell;

(b) means for picking a new orientation for said picked cell;

(c) means for determining a revised net length for said picked cell in said new orientation;

(d) means for determining whether said revised net length is less than said net length, wherein when said revised net length is not less than said net length, a determination is made as to whether any new additional orientations for said picked cell exist, wherein if said new additional orientations exist, picking said new orientation from said new additional orientations for said picked cell; and (e) means for moving said picked cell to said new orientation when it is determined that said revised net length is less than said net length.

* * * * *